United States Patent [19]
Strohl

[11] 4,066,982
[45] Jan. 3, 1978

[54] OSCILLATOR CIRCUIT COMPRISING INTEGRATED MIS FIELD-EFFECT TRANSISTORS

[75] Inventor: Klaus D. Strohl, Freiburg im Breisgau, Germany

[73] Assignee: ITT Industries, Incorporated, New York, N.Y.

[21] Appl. No.: 776,674

[22] Filed: Mar. 11, 1977

[30] Mar. 30, 1976 Germany .................. 2613421
[51] Int. Cl.² ........................................... H03K 3/283
[52] U.S. Cl. ............................... 331/111; 307/291; 331/108 D; 331/113 R
[58] Field of Search ............... 331/108 C, 108 D, 111, 331/113 R; 307/291, 304

[56] References Cited

U.S. PATENT DOCUMENTS

| 3,975,649 | 8/1976 | Kawagoe | 331/111 |
| 4,015,219 | 3/1977 | Kawagoe | 331/111 |

Primary Examiner—John Kominski
Attorney, Agent, or Firm—John T. O'Halloran; Peter C. Van DerSluys; Vincent B. Ingrassia

[57] ABSTRACT

The temperature dependence of the oscillator frequency of an integrated RC oscillator comprising an RS flip-flop with two load MISFETs, is compensated by means of an additional MISFET, the drain of which is connected to the gate electrodes of said load MISFETs and the gate electrode of said additional MISFET is connected to the supply voltage.

2 Claims, 3 Drawing Figures

A

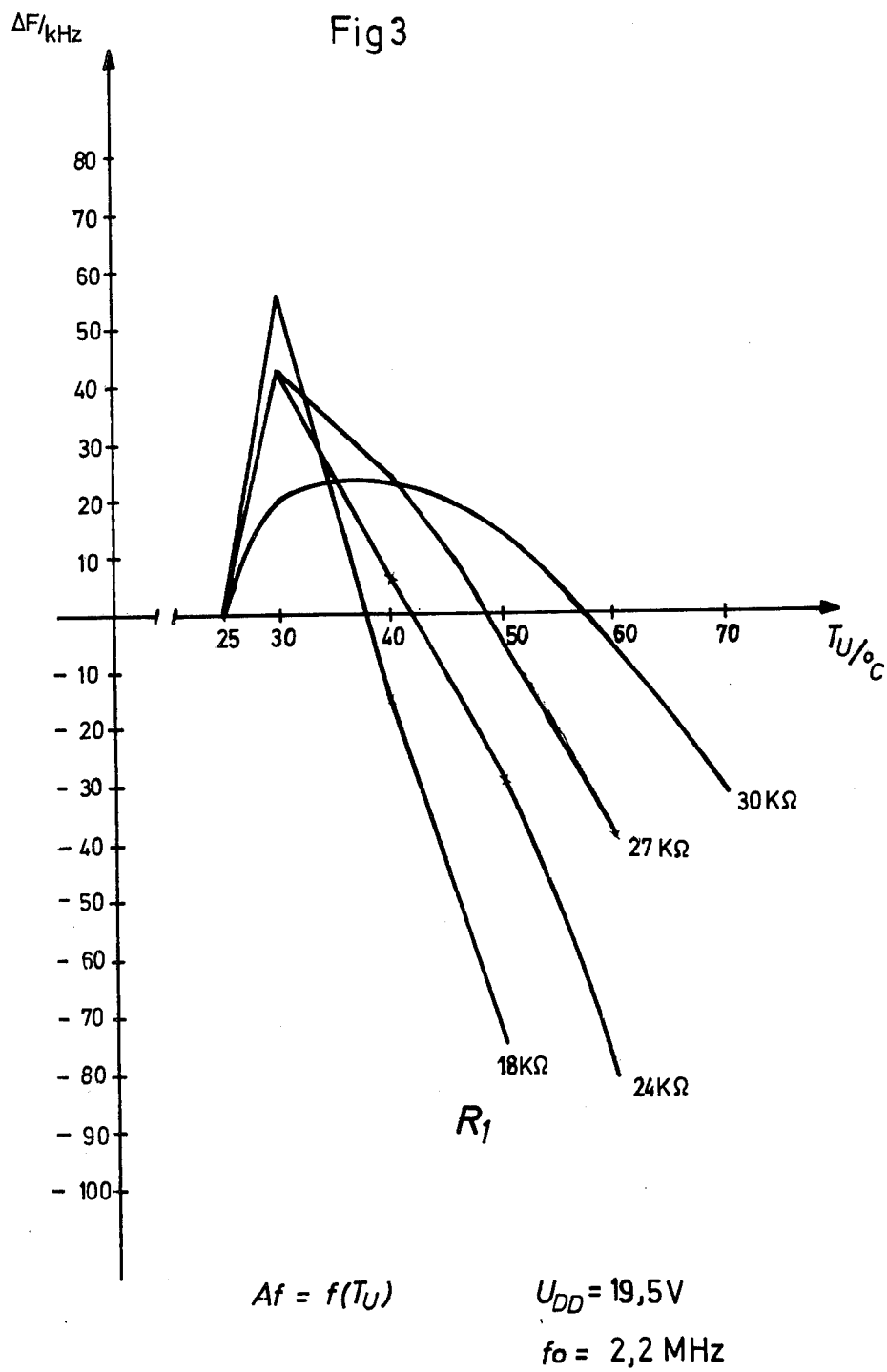

OSCILLATOR CIRCUIT COMPRISING INTEGRATED MIS FIELD-EFFECT TRANSISTORS

BACKGROUND OF THE INVENTION

This invention relates to an oscillator circuit consisting of an RS flip-flop with integrated insulated gate (MIS) field-effect transistors whose inputs, each with a capacitor, are connected to ground, and which is capable of being controlled via a controlled inverter.

In the past, such circuits have been severely temperature-dependent since the switchover point of the flip-flop circuit varied with temperature, thus either raising or lowering the oscillator frequency.

SUMMARY OF THE INVENTION

It is an object of the present invention to provide an oscillator circuit comprising integrated MIS field-effect transistors which includes temperature compensation of the oscillator frequency.

According to a broad aspect of the invention, there is provided an oscillator circuit including temperature compensating means and means for coupling said oscillator circuit to an external power source having an internal resistance, comprising: an RS flip-flop having first and second inputs; first and second capacitors for coupling said first and second inputs respectively to ground; first and second inverters, each containing a load transistor, said first and second inputs each controlled by one of said load transistors; and a first transistor for providing temperature compensation of the oscillator frequency, said first transistor having a source electrode coupled to ground, a gate electrode coupled to a first source of supply voltage and a drain electrode coupled to the gate electrodes of said load transistors and to said external power source, said first transistor having a drain-source resistance in the order of the internal resistance of said external power source.

The above and other objects of the present invention will be more clearly understood from the following detailed description taken in conjunction with the accompanying drawings, in which:

BRIEF DESCRIPTION OF THE DRAWINGS

FIG. 3 serves to explain the temperature compensation by the circuit arrangements according to the invention.

DESCRIPTION OF THE PREFERRED EMBODIMENT

Figure 1:
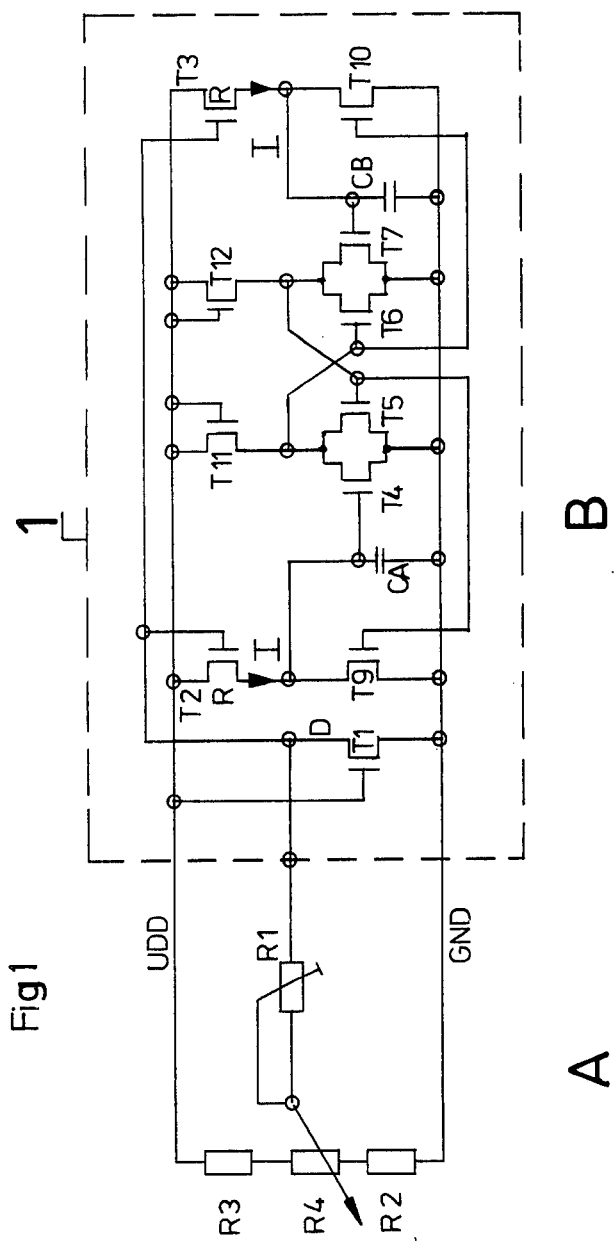
FIG. 1 shows the oscillator circuit according to the invention.

FIG. 1, within the dot-and-dash line 1, shows the integrated RS flip-flop circuit B which, according to the invention, and for compensating for the temperature dependence of the oscillator frequency, is provided with an insulated-gate field-effect transistor $T_1$ whose drain electrode D is connected to the two gate electrodes of the controlled load transistors $T_2$ and $T_3$, and whose gate electrode is applied to the supply voltage $U_{DD}$. The circuit of the integrated RS flip-flop is well known in the art and, together with the inverters $T_2$, $T_9$ and $T_3$, $T_{10}$ operates as an oscillator.

This RS flip-flop used as an oscillator, comprises parallel-connected pairs of insulated-gate field-effect transistors $T_4$, $T_5$, $T_6$, $T_7$ which are galvanically cross-coupled. The voltage supply of the two parallel-connected pairs of insulated-gate field-effect transistors is effected each time by one insulated-gate field-effect transistor $T_{11}$; $T_{12}$ whose gate electrodes are applied to the voltage supply $U_{DD}$.

The two inputs of the RS-flip-flop circuit corresponding to the gate electrodes of those insulated-gate field-effect transistors $T_4$ and $T_7$ whose gate electrodes are not cross-coupled to the drain electrodes of the parallel-connected pairs of insulated-gate field-effect transistors $T_4$, $T_5$; $T_6$, $T_7$ are connected to one common connecting point. Each series connection of two insulated gate field-effect transistors $T_2$ and $T_9$ or $T_3$ and $T_{10}$ form one inverter.

The gate electrodes of the two controlled insulated-gate load transistors (MISFETs) $T_2$ and $T_3$, according to the invention, are together applied to the drain electrode D of the insulated-gate field-effect transistor $T_1$ which effects the temperature compensation of the oscillator frequency of the RS flip-flop circuit. The gate electrodes of the two other insulated-gate field-effect transistors $T_9$ and $T_{10}$ are applied to the cross-coupled gate electrodes of the insulated-gate field-effect transistors of the aforementioned parallel arrangements of the RS flip-flop.

The oscillator consists of an RS flip-flop whose input signals are produced by two charging circuits $R.C_A$ and $R.C_B$. The frequency is adjusted by a control signal which is applied from an external voltage source A to the drain electrode of the insulated-gate field-effect transistor $T_1$ which effects the temperature compensation. In this way the time constant of the RC-circuit is varied, thus controlling the switch over (trigger) point of the flip-flop circuit.

The temperature dependence of the oscillator frequency of the RS flip-flop circuit without this insulated-gate field-effect transistor $T_1$ provided for effecting the temperature compensation, amounted to about $$\Delta f/f_0 \approx 20\% \text{ at } T_U = 20° \text{ C to } 70° \text{ C},$$

which, in a first approximation, is effected by the temperature dependence of the charge-carrier movability and the threshold voltage of the respective insulated-gate field-effect transistors. In this, the influence of the temperature dependence of the charge-carrier movability is dominating.

Any increase in temperature causes the current I to become smaller, accordingly, the switchover (trigger) point of the flip-flop circuit is reached later and, consequently, the frequency is lower. When using the insulated-gate field-effect transistor $T_1$ which is provided for compensating the oscillator frequency, and which represents a temperature-dependent resistor, it is possible by suitably dimensioning the internal resistance of the external voltage source A, to reach a frequency stability of about two percent (2%) within an ambient temperature range from 20° to 70° C. According to the invention, this is accomplished when the internal resistance of the external source of voltage reaches the order of the source-drain resistance of the insulated-gate field-effect transistor $T_1$ which is intended to effect the temperature compensation.

Preferably, the source of voltage consists of an ohmic voltage divider which is arranged between $U_{DD}$ and the ground potential.

The mode of operation of the temperature compensation is due to the fact that the reduction of the charging current I as caused by the increased temperature, is compensated for by increasing the control voltage at the drain electrode of the insulated-gate field-effect transistor $T_1$.

Figure 2:
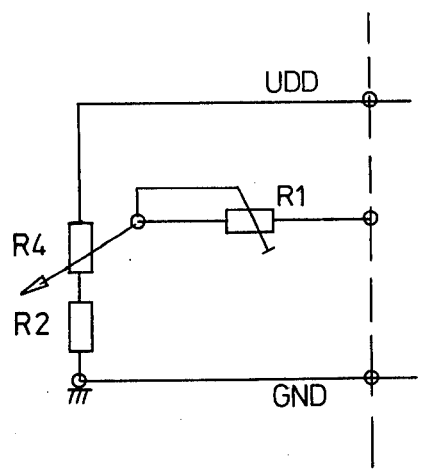
FIG. 2 shows the circuit of a preferred embodiment of the external voltage source to be used in the oscillator circuit according to the invention.

In FIG. 3 there is illustrated the mode of operation of the temperature compensation of the oscillator frequency of the RS flip-flop circuit as effected by an ohmic voltage divider according to FIG. 2 with $R_1 = $ 18 k$\Omega$, 24 k$\Omega$, 27 k$\Omega$ and 30 k$\Omega$, a supply voltage $U_{DD}$ of 19.5 V, $R_4 = $ 5 k$\Omega$ and $R_2 = $ 10 k$\Omega$. The control voltage is adjusted at $R_4$. On the ordinate, at an oscillator frequency of 2.2 MHz, the frequency variation $\Delta f$ is plotted in kHz in dependence upon the ambient temperature $T_U$ in ° C.

Measurements performed with other supply voltages $U_{DD}$ have shown a dependence of the temperature compensation upon the supply voltage $U_{DD}$. The drain-source resistance of the insulated-gate field-effect transistor $T_1$ was at about 40 k$\Omega$. Such values are obtained for $K = W/L = 0.3$ with $W = $ channel width and $L = $ channel length of the insulated-gate field-effect transistor $T_1$.

What is claimed is:

1. An oscillator circuit including temperature compensating means and means for coupling said oscillator circuit to an external power source having an internal resistance, comprising:
   an RS flip-flop having first and second inputs;
   first and second capacitors for coupling said first and second inputs respectively to ground;
   first and second inverters, each containing a load transistor, said first and second inputs each controlled by one of said load transistors; and
   a first transistor for providing temperature compensation of the oscillator frequency, said first transistor having a source electrode coupled to ground, a gate electrode coupled to a first source of supply voltage and a drain electrode coupled to the gate electrodes of said load transistors and to said external power source, said first transistor having a drain-source resistance in the order of the internal resistance of said external power source.

2. An oscillator circuit according to claim 1 wherein said external power source includes an ohmic voltage divider coupled between said first supply voltage and ground.

* * * * *